US008492961B2

(12) United States Patent
Zeng

(10) Patent No.: US 8,492,961 B2
(45) Date of Patent: Jul. 23, 2013

(54) HEAT SINK ASSEMBLY

(75) Inventor: Yichong Zeng, Chelmsford, MA (US)

(73) Assignee: Osram Sylvania Inc., Danvers, MA (US)

( * ) Notice: Subject to any disclaimer, the term of this patent is extended or adjusted under 35 U.S.C. 154(b) by 204 days.

(21) Appl. No.: 13/235,551

(22) Filed: Sep. 19, 2011

(65) Prior Publication Data

US 2013/0068439 A1 Mar. 21, 2013

(51) Int. Cl.
*F21V 19/00* (2006.01)

(52) U.S. Cl.
USPC ............. 313/46; 362/218; 362/373; 362/612; 362/311.02; 362/294; 313/47

(58) Field of Classification Search
USPC .................. 362/249.02, 612, 555, 545, 800, 362/311.02, 218, 264, 294, 345, 373, 580; 165/185; 313/46–47
See application file for complete search history.

(56) References Cited

U.S. PATENT DOCUMENTS

| | | | |
|---|---|---|---|
| 4,574,879 A | 3/1986 | DeGree et al. | |
| 4,602,125 A | 7/1986 | West et al. | |
| 4,602,678 A | 7/1986 | Fick | |
| 4,685,987 A | 8/1987 | Fick | |
| 4,842,911 A | 6/1989 | Fick | |
| 6,090,484 A | 7/2000 | Bergerson | |
| 6,161,910 A | 12/2000 | Reisenauer et al. | |
| 6,165,612 A | 12/2000 | Misra | |
| 6,657,297 B1 | 12/2003 | Jewram et al. | |
| 6,888,257 B2 | 5/2005 | Wilson et al. | |
| 8,018,136 B2 * | 9/2011 | Gingrich et al. | 313/498 |

OTHER PUBLICATIONS

Flame Retardant Class 4 (FR-4) PC board data sheet published on Wikipedia prior to invention date hereof, retrieved from website http://wikipedia.org/wiki/FR-4 on Aug. 19, 2011 (3 pages).
"Thermal Management for LED Applications Solutions Guide", published by The Bergquist Co. prior to Mar. 21, 2009 (6 pages, color).
Data sheet for Lord TC-405 Thermally Conductive Grease, Lord company, published 2010 (2 pages).
Extract from "Underwriters Labs .Inc. Standard for Safety—Self-Ballasted Lamps and Lamp Adapters, UL, 1993", (UL, Third Ed. dated Aug. 28, 2009), Test 8.6 "dialectric voltage-withstand test", cover page and pp. tr1, tr2, and 32-33 (5 pages).
Data sheet for Sil-Pad® 1500ST conductive elastomer, The Bergquist Company published prior to invention herein and identifying 5 patents cited herewith (1 page).

(Continued)

*Primary Examiner* — Anne Hines
*Assistant Examiner* — Jose M Diaz
(74) *Attorney, Agent, or Firm* — Edward S. Podszus

(57) ABSTRACT

A heat sink assembly (216) includes a heat sink (218) having an upper surface (220), a lower surface (222), a non-metal-core circuit board (224) disposed in register with the upper surface (220), and at least one solid state electronic component (SSEC) (226) electrically coupled to the circuit board (224) such that an underside (228) of each SSEC (226) is not in confronting relationship with the circuit board (224). A first thermal interface material (232) is disposed between and thermally coupled to the underside (228) of the SSEC (226) and the upper surface (220), the first thermal interface material (232) being electrically and thermally conductive. A second thermal interface material (236) is disposed in thermal communication with the lower surface (222) and spreads heat to the second heat sink (104), the second thermal interface material (236) being electrically insulating and thermally conductive.

15 Claims, 3 Drawing Sheets

OTHER PUBLICATIONS

Data sheet for Lord MT-815 low modulus Thermally conductive Adhesive, published Jul. 2010 (2 pages).

Data sheet for CoolPoly D5506 thermally conductive LCP, pubd. by Cool Polymers, Inc. dated Sep. 7, 2007 (1pg).

* cited by examiner

HEAT SINK ASSEMBLY

CROSS-REFERENCE TO RELATED APPLICATIONS

Not applicable.

FIELD

The present disclosure relates generally to heat sinks, and, more particularly, to a heat sink assembly for solid-state light sources.

BACKGROUND

Solid-state lighting may include one or more LEDs as a source of illumination and provide numerous benefits including, but not limited, increased efficiency and lifespan. Similar to other types of lamps, an LED lamp emits energy in the form of radiant energy and heat. The heat generated by the lamp can cause problems (such as, but not limited to, reduced lifespan and reduced lumen output). As such, proper management of thermal energy within an LED lamp may result in improved life, decrease package size, and in some cases, improve lumen output. An additional benefit of removing thermal energy from the lamp is that the lamp can be operated in a higher ambient temperature environment without compromising life or performance of the lamp.

Some LED lamps include known configurations and/or mechanisms adapted to dissipate and/or remove thermal energy from the lamp. For example, some LED lamps include a lighting module featuring a printed circuit board (PCB) having one or more LEDs, in which the lighting module is secured to a heat sink adapted to dissipate thermal energy generated at least by the LEDs. Additionally, a thermal interface material may be provided between the light module and the heat sink, ensuring that the light module remains in thermal contact with the heat sink with reasonable shock and vibration by minimizing any potential air gaps between the light module and the heat sink.

Light modules may include various types LEDs (such as, but not limited to, ceramic and metal base LEDs) and PCBs (such as, but not limited to, FR-4 boards and metal core PCBs, which have different soldering interfaces). Some LEDs (e.g. ceramic base LEDs) may lack solder pads on the underside, such that, these types of LEDs may not be soldered to a metal core PCB. Known lighting modules further include a thermal interface material disposed between at least the LEDs and the heat sink of the lamp, such as a thermal pad or putty. Some lamps further include a mechanism configured to apply pressure to and hold the LEDs to the heat sink. This known assembly results in a more complex light module structure and reduces thermal space within the lamp, thereby reducing the thermal performance and potential lumen output of the lamp.

BRIEF DESCRIPTION OF THE DRAWINGS

Reference should be made to the following detailed description which should be read in conjunction with the following figures, wherein like numerals represent like parts.

Figure 1:
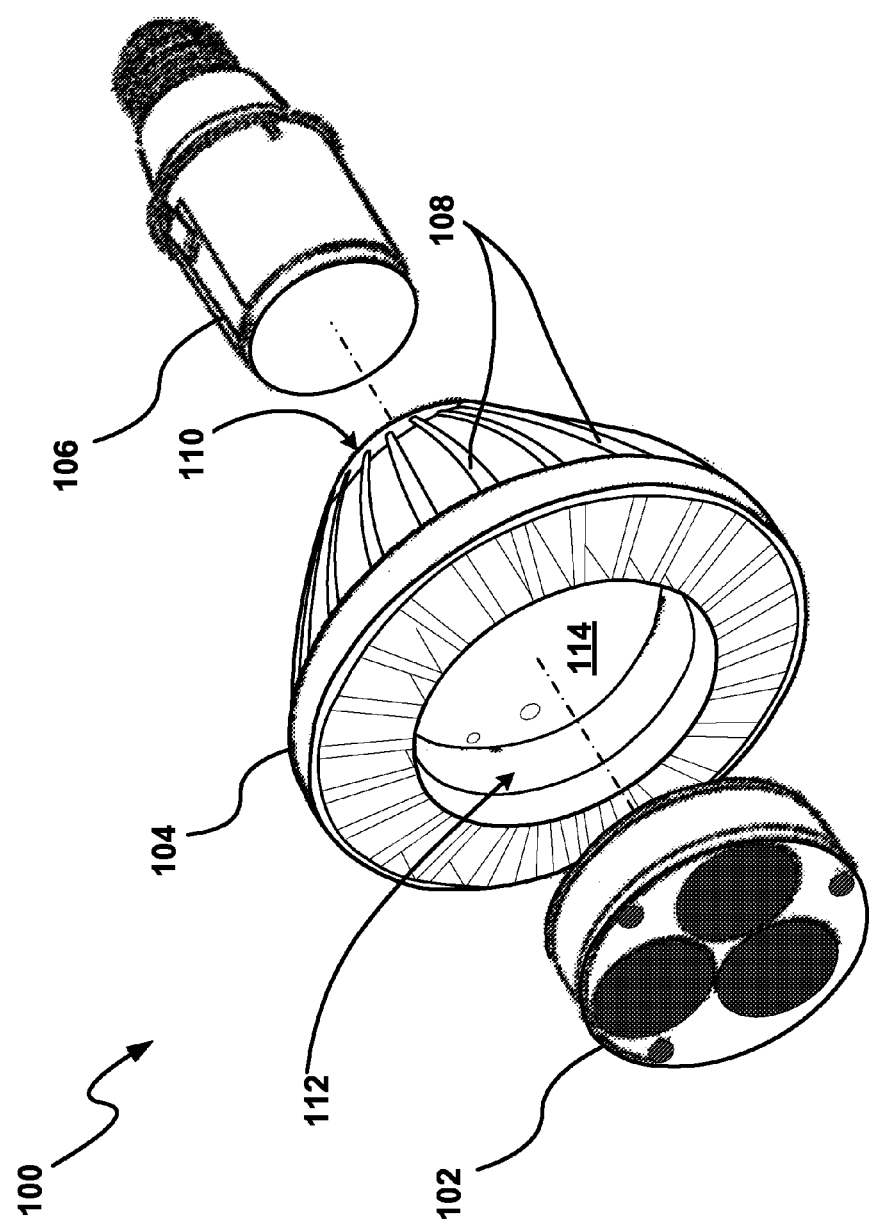
FIG. 1 generally illustrates an exploded view of one embodiment of an LED lamp consistent with the present disclosure.

For a thorough understanding of the present disclosure, reference should be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting.

DETAILED DESCRIPTION

By way of a brief overview, one embodiment of the present disclosure may feature a heat sink assembly including a heat sink having an upper surface facing in a first direction and a lower surface facing in an opposing second direction, the lower surface adapted to thermally communicate with a second heat sink when placed proximate to the second heat sink. The heat sink assembly also includes a non-metal-core circuit board disposed in register with the heat sink upper surface and at least one solid state electronic component, such as an LED, mounted in electrically operative association with the circuit board. A first thermal interface material, being electrically and thermally conductive, is disposed between the underside of the at least one solid state electronic component and the heat sink upper surface, wherein the first thermal interface material is thermally coupled to the at least one solid state electronic component and to the heat sink upper surface. Additionally, a second thermal interface material, being electrically insulating and thermally conductive, is disposed between the heat sink lower surface and the second heat sink, wherein the second thermal interface material is in thermal communication with the heat sink lower surface and adapted to spread heat to the second heat sink. The heat sink assembly may be configured to be integrated with an existing light module of an LED lamp.

A heat sink assembly consistent with at least one embodiment of the present disclosure may provide numerous advantages. For example, a heat sink assembly consistent with the present disclosure increases the effective thermal contact area of a light module with respect to a heat sink of a lamp. As a result, the thermal performance of the light source may be increased, the solid-state electronic component's junction temperature may be reduced, and the total lumen output of the heat sink assembly may be increased. Additionally, a heat sink assembly consistent with the present disclosure provides reliable electrical isolation for solid state electronic components (e.g., LEDs) within limited spaces, thereby increasing design flexibility. Further advantages of a heat sink assembly consistent with the present disclosure will be described in greater detail below.

Turning now to the figures, FIG. 1 generally illustrates an exploded view of one embodiment of a solid-state lighting lamp 100 (hereinafter generally referred to as an LED lamp 100 for convenience). The LED lamp 100 generally includes a light module 102, a heat sink 104, and an electronics module 106. By way of a brief overview, the light module 102 and electronics module 106 are configured to be selectively attached and detached with the heat sink 104. When the LED lamp 100 is assembled, the light module 102 and the electronics module 106 are electrically coupled. The electronics module 106 is configured to be electrically and/or mechanically coupled to an external power supply (e.g. an electrical socket coupled to an AC or DC power source, not shown) and provide power to the light module 102 and components thereon.

The heat sink 104 includes one or more structures configured to transfer heat generated by the light module 102 and/or electronics module 106 to a fluid medium, such as air or liquid. The heat sink 104 may be constructed from a variety of known materials, such as, but not limited to, aluminum, copper, or an alloy thereof. The size, shape, and configuration of the heat sink 104 may depend on the intended application (e.g., the desired amount of heat to be transferred). For example, the heat sink 104 includes a plurality of heat-radiating fins 108 configured to increase the surface area of the heat sink 104 and dissipate heat from the light module 102 and/or electronics module 106 to the surrounding air. The heat-radiating fins 108 may be disposed generally longitudinally and/or radially, and may include, but are not limited to, straight fins and/or flared fins. It should be appreciated, however, that this is only one example and that the heat sink 104 may include other types of heat radiating/dissipating structures such as, but not limited to, pins (e.g., cylindrical, elliptical and/or square pins).

The heat sink 104 includes a first and a second region 110, 112. The first region 110 is configured to receive at least a portion of the electronics module 106. According to one embodiment, the first region 110 may form a generally cylindrical cavity (not shown) having dimensions closely matching a portion of the electronics module 106 (e.g., to increase heat transfer from the electronics module 106 into the heat sink 104).

The second region 112 of the heat sink 104 is configured to receive at least a portion of the light module 102. According to one embodiment, the second region 112 may form a cavity having dimensions closely matching a portion of the light module 102 (e.g., to increase heat transfer from the light module 102 into the heat sink 104). While the second region 112 is illustrated defining a generally cylindrical cavity, the second region 112 may define non-cylindrical cavities.

The second region 112 may include a base 114. According to one embodiment, the first and second regions 110, 112 may be disposed at generally opposite ends of the heat sink 104 and may be separated by the base 114 of the second region 112. The second region 112 may be configured to receive the light module 102 such that a portion of the light module 102 engages the base 114 to facilitate heat transfer from the light module 102 into the base 114 of the heat sink 104. The second region 112 may include a locking mechanism/feature configured to cooperate with the light module 102 to couple, mount, or otherwise secure the light module 102 to the heat sink 104. The locking feature may include, but is not limited to, an optical cover (not shown), a groove or slot configured to engage with a corresponding locking feature on the light module 102 (e.g., a tab or protrusion, not shown) in a locking fashion, snap connections, threaded connections, interference connections, screws (e.g., a set screw), bolts, clamps, fasteners, and the like (not shown).

Figure 2:
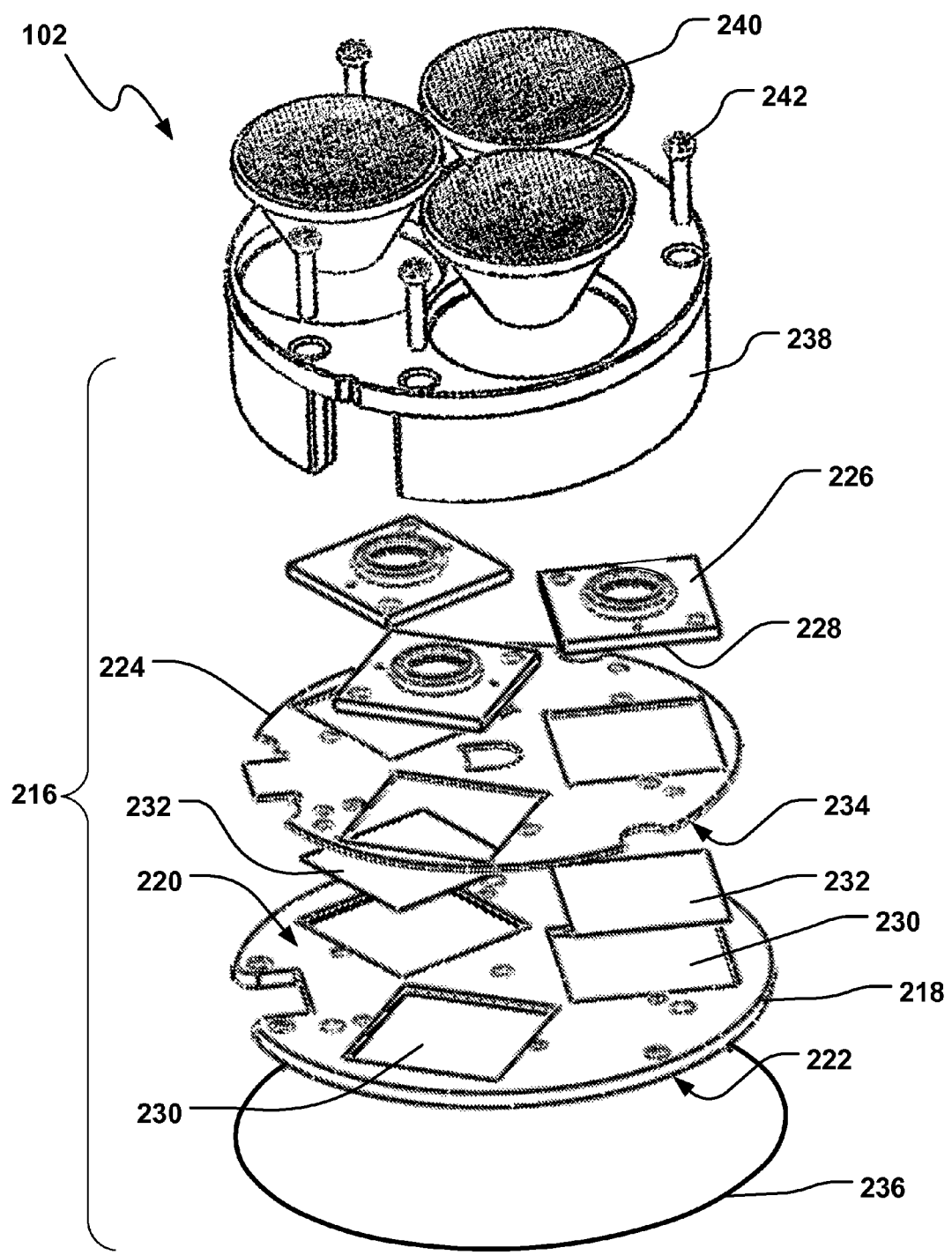
FIG. 2 generally illustrates an exploded view of the light module of FIG. 1.
Figure 3:
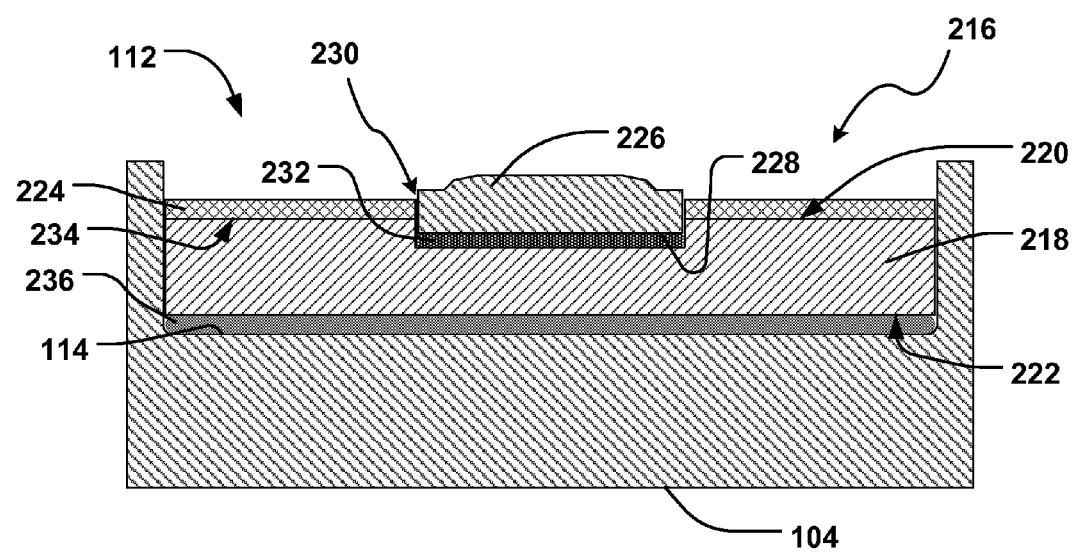
FIG. 3 generally illustrates a cross-sectional view of a portion of one embodiment of an assembled LED lamp.

Turning now to FIGS. 2 and 3, FIG. 2 generally illustrates an exploded view of the light module 102 of FIG. 1 including a heat sink assembly 216 and FIG. 3 generally illustrates a cross-sectional view of a portion of one embodiment of an assembled LED lamp 100 showing a portion of the heat sink assembly 216 of FIG. 2 coupled to the heat sink 104 of the LED lamp 100 of FIG. 1. The light module 102 includes a heat sink assembly 216. As shown, the heat sink assembly 216 includes a heat sink 218 (hereinafter referred to as "heat spreader 218") having an upper surface 220 facing in a first direction and a lower surface 222 facing an opposing second direction. The heat spreader 218 may be coupled, mounted, or otherwise secured to a non-metal-core circuit board 224 and at least one solid state electronic component (e.g. a light emitting diode (LED) 226) mounted to the circuit board 224. As shown, the circuit board 224 and the at least one LED 226 are disposed in register with a portion of the upper surface 220 of the heat spreader 218. The upper surface 220 of the heat spreader 218 is adapted to thermally communicate with the LEDs 226 and/or circuit board 224.

The non-metal-core circuit board 224 may include, for example, a Flame Retardant Class 4 (FR-4) printed circuit board (PCB). The at least one LED 226 is mounted in electrically operative association with the circuit board 224, such that an underside 228 of each of the LEDs 226 is in a non-confronting relationship with the circuit board 224. For example, the underside 228 of each of the LEDs 226 lacks solder pads, wherein each of the LEDs 226 are electrically coupled to the circuit board 224 by other mechanisms generally understood by one skilled in the art such as, but not limited to, one or more wires, electrical traces, and the like.

The LEDs 226 may be arranged in one or more arrays of LEDs 226 that may be simultaneously and/or independently controlled. The LEDs 226 may include any semiconductor light source such as, but not limited to, conventional high-brightness semiconductor LEDs, organic light emitting diodes (OLEDs), bi-color LEDs, tri-color LEDs, polymer light-emitting diodes (PLED), electro-luminescent strips (EL), etc. The LEDs 226 may include, but are not limited to, packaged and non-packaged LEDs, chip-on-board LEDs, as well as surface mount LEDs. The LEDs 226 may also include LEDs with phosphor or the like for converting energy emitted from the LED to a different wavelength of light.

The heat spreader 218 is configured to dissipate thermal energy generated by at least the LEDs 226. As discussed, the upper surface 220 of the heat spreader 218 is adapted to thermally communicate with the LEDs 226 and/or circuit board 224. Additionally, the lower surface 222 of the heat spreader 218 is adapted to thermally communicate with the heat sink 104 when placed proximate to the heat sink 104 (e.g., as generally illustrated in FIG. 3). The heat spreader 218 may include a material having a high thermal conductivity capable of dissipating heat generated by at least the LEDs 226, such as, but not limited to, a metallic material, a thermally conductive ceramic material, a thermally conductive polymer material, and/or combinations thereof. In the illustrated embodiment, for example, the heat spreader 218 is aluminum. In another embodiment, the heat spreader 218 may include a thermally conductive polymer such as CoolPoly® D5506 Thermally Conductive Liquid Crystalline Polymer (LCP) manufactured by Cool Polymers Incorporated.

The heat spreader 218 is adapted to be received within the second region 112 of the heat sink 104, for example, as can most clearly be seen in FIG. 3. The heat spreader 218 may have various shapes and/or sizes, e.g. plate or curved dimensions, depending on the internal structure of the heat sink 104, particularly the structure of the second region 112. Additionally, the heat spreader 218 may include mounting features, e.g., pockets, holes, slots, etc., configured to aid in aligning and/or retaining the LEDs 226, thereby providing a greater design/packaging flexibility. In the illustrated embodiment, for example, the heat spreader 218 includes at least one recess 230 defined in the top surface 220, wherein the recess 230 may be adapted to receive and accommodate a portion of an associated LED 226. The recess 230 may be configured to aid in accommodating, for example, taller LEDs, thereby allowing greater design/packaging flexibility. Additionally, the recess 230 may be configured to aid in alignment of the associated LED 226 with an optical lens of the light module. In other embodiments, the heat spreader 218 may include a substantially flat upper surface devoid of any recesses.

The heat sink assembly 216 further includes a first thermal interface material 232 disposed between the underside 228 of each of the LEDs 226 and the upper surface 220 of the heat spreader 218, such that the first thermal interface material 232 is thermally coupled to each of the LEDs 226 and to the upper surface 220 of the heat spreader 218. When fully assembled, the heat spreader 218 is electrically isolated from each of the LEDs 226 via the first thermal interface material 232. Additionally, at least a portion between an undersurface 234 of the circuit board 224 and the heat spreader 218 is devoid of the first thermal interface material 232 (shown in FIG. 3). For example, as shown, the first thermal interface material 232 is positioned within each recess 230 of the heat spreader 218, wherein the underside 228 of each associated LED 226 is coupled (e.g., contacts and/or abuts) to the first thermal interface material 230 when received within the associated recess 230 and at least a portion of the heat spreader 218 is coupled (e.g., contacts and/or abuts) to the first thermal interface material 230.

The heat sink assembly 216 further includes a second thermal interface material 236 disposed on and in thermal communication with the lower surface 222 of the heat spreader 218. The second thermal interface material 236 is adapted to spread (i.e., transfer) heat from the heat spreader 218 to the heat sink 104 when the lower surface 222 is proximate the heat sink 104 (e.g., when the heat spreader 218 is received within second region 112 of the heat sink 104 as generally illustrated in FIG. 3). In particular, the second thermal interface material 236 is positioned between the lower surface 222 of the heat spreader 218 and the base 114 of the second region 112 of the heat sink 104 (shown in FIG. 3). The second thermal interface material 236 may ensure that the light module 102 remains in thermal contact with the second region 112 of the heat sink 104 with reasonable shock and vibration by minimizing any potential air gaps between the light module 102 and the second region 112 (e.g., the base 114) of the heat sink 104. The properties of the first and second thermal interface materials 232, 236 will be described in greater detail below.

The heat sink assembly 216 further includes a body or housing 238 disposed on the heat spreader 218 enclosing the circuit board 224, LEDs 226, and the first thermal interface material 232 within. The housing 238 may be configured to be coupled, mounted, or otherwise secured to the heat spreader 218. The housing 238 is shaped and/or sized to be at least partially received within the second region 112 of the heat sink 104. The housing 238 includes at least one optical element 240 in register with, and positioned in optically operative relationship to, at least one LED 226. Each optical element 240 may be adapted to shape light emitted from the LED 226.

The housing 238 may be made from an optically reflective plastic material to increase the optical performance of the light module 102. In some embodiments, the housing 238 may include one or more mechanical interfaces configured to engage a corresponding mechanical interface of the heat sink 104 to align the light module 102 and heat sink assembly 216 with respect to the second region 112 of the heat sink 104. Examples of mechanical interfaces may include, but are not limited, to tabs, protrusion, slots, grooves, keys, and the like. While the illustrated embodiment shows the housing 238 secured to the heat spreader 218 using a plurality of fasteners (e.g., screws or bolts) 242, it should be understood that the housing 238 and heat spreader 218 may be secured together using any suitable means as generally understood by one of ordinary skill in the art (such as, but not limited to, welding, adhesives, clamps, threaded connections, snap fits, interference fits, and the like).

As described herein, the heat sink assembly 216 includes a first thermal interface material 232 disposed between the LEDs 226 and the upper surface 220 of the heat spreader 218 and a second thermal interface material 236 disposed between the lower surface 222 of the heat spreader 218 and the base 114 of the heat sink 104. The first thermal interface material 232 is electrically and thermally conductive and the second thermal interface material 236 is electrically insulating and thermally conductive. The terms "electrically conductive" and "electrically insulating", as used herein in reference to the first and second thermal interface materials, are distinguishable based on results obtained via a "Dielectric voltage-withstand test" (Underwriters Laboratories Inc. (UL) Standard for Safety for Self-Ballasted Lamps and Lamp Adapters, UL 1993 Third Edition, pp. 32-33, Aug. 28, 2009). In particular, if a material "passes" the above test, the material is referred to as being "insulating". Alternatively, if a material "fails" the above test, the material is referred to as being "conductive". As such, the first thermal interface material 232 "fails" the test and is therefore electrically conductive and the second thermal interface material 236 "passes" the test and is therefore electrically insulating, according to the "Dielectric voltage-withstand test" disclosed above.

The first thermal interface material 232 exhibits a thermal impedance of less than 0.23 degrees Celsius*inch$^2$ per Watt (° C.·in$^2$/Watt). The first thermal interface material 232 may include, for example, a conductive adhesive, the conductive adhesive being metal filled, a thermal grease, a thermal gel, a thermal adhesive, and/or combinations thereof. An example of the first thermal interface material 232 may include, but is not limited to, Lord® MT-815 low modulus thermally conductive adhesive, available from LORD Corporation™.

The second thermal interface material 236 exhibits a thermal impedance of equal to or greater than 0.23 degrees Celsius*inch$^2$ per Watt (° C.·in$^2$/Watt). Examples of second thermal interface materials 236 include, but are not limited to, thermal pad, thermal grease, epoxy, phase change materials, thermal tapes, and the like. In one embodiment, for example, the second thermal interface material 236 includes a fiberglass reinforced silicone elastomer, such as Sil-Pad® 1500ST, a thermal pad available from The Bergquist Company™.

A heat sink assembly consistent with the present disclosure was tested for thermal transfer performance. The tests were performed using a Sylvania® PAR38 LED lamp including Nichia® L110 LEDs available from Nichia Corporation™, Japan. In particular, Table 1 below shows the thermal transfer performance results generated by the tests.

TABLE 1

| Description | Thermal Efficiency | Lamp Efficiency Improvement | LED Junction Temperature Improvement |
|---|---|---|---|
| Reference LED lamp without heat sink assembly 20 W | 93.3% | Base efficiency (i.e., 0%) | Base temperature |
| LED lamp with heat sink assembly, 20 W | 94.6% | +1.3% | ~6° C.* |

TABLE 1-continued

| Description | Thermal Efficiency | Lamp Efficiency Improvement | LED Junction Temperature Improvement |
|---|---|---|---|
| Reference LED lamp without heat sink assembly, 25 W | 92.2% | Base efficiency (i.e., 0%) | Base temperature |
| LED lamp with heat sink assembly, 25 W | 93.4% | +1.2% | ~6° C.* |

*LED junction temperature improvement is calculated based on Nichia LED's datasheet and all measurements are measured in a 25° C. environment.

As shown, the tests included running a reference LED lamp (i.e., an LED lamp without a heat sink assembly consistent with the present disclosure) at 20 W and 25 W. The test further included running an LED lamp including a heat sink assembly consistent with the present disclosure at 20 W and 25 W. It should be noted, the heat sink assembly, as tested, included a heat spreader made of an aluminum material. More specifically, the heat spreader included a 6061 aluminum alloy. As can be seen, a LED lamp having a heat sink assembly consistent with the present disclosure resulted in an increase in thermal efficiency of the LED lamp of 1.3% and 1.2% for the 20 W and 25 W lamps, respectively, as well as a reduction in the LED junction temperature of approximately 6° C. for both the 20 W and 25 W lamps.

A heat sink assembly consistent with the present disclosure can effectively improve the thermal and electrical performance for a variety of existing modular light engine applications, allowing a modular light engine to better adapt to more LED technologies (such as high voltage or low voltage LEDs, different LED packages with metal base or ceramic base, isolated or non-isolated drivers, etc.). Additionally, a heat sink assembly consistent with the present disclosure can improve light engine thermal design for retrofit lamps, or other compact solid state lighting devices where the light engine has limited spaces.

Accordingly, consistent with one embodiment of the present disclosure, a heat sink assembly for a solid state electronic component, the heat sink assembly comprising a heat sink having an upper surface facing in a first direction and a lower surface facing in a second direction opposed to the first direction, the lower surface adapted to thermally communicate with a second heat sink when placed proximate the second heat sink. The heat sink assembly further includes a non-metal-core circuit board disposed in register with the heat sink upper surface and at least one solid state electronic component mounted in electrically operative association with the circuit board such that an underside of each the at least one solid state electronic component is not in confronting relationship with the circuit board. A first thermal interface material is disposed between the underside of the at least one solid state electronic component and the heat sink upper surface and thermally coupled to the at least one solid state electronic component and to the heat sink upper surface, the first thermal interface material being electrically and thermally conductive. A second thermal interface material is disposed in thermal communication with the heat sink lower surface and adapted to spread heat to the second heat sink, the second thermal interface material being electrically insulating and thermally conductive.

As used in any embodiment herein, "circuitry" may comprise, for example, singly or in any combination, hardwired circuitry, programmable circuitry, state machine circuitry, and/or firmware that stores instructions executed by programmable circuitry. In at least one embodiment, the light module and/or electronics module may include a controller, photodetector, PWM circuitry and/or driver circuitry (not shown) that may collectively or individually comprise one or more integrated circuits. An "integrated circuit" may be a digital, analog or mixed-signal semiconductor device and/or microelectronic device, such as, for example, but not limited to, a semiconductor integrated circuit chip.

As used herein, the designation (1)-(n) in connection with reference numerals should be interpreted as a repetition of like components (which may be identical, similar, or different). The terms "first," "second," and the like herein do not denote any order, quantity, or importance, but rather are used to distinguish one element from another, and the terms "a" and "an" herein do not denote a limitation of quantity, but rather denote the presence of at least one of the referenced item.

The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals.

Reference in the specification to "one embodiment" or "an embodiment" of the present disclosure means that a particular feature, structure or characteristic described in connection with the embodiment is included in at least one embodiment of the present disclosure. Thus, the appearances of the phrase "in one embodiment" appearing in various places throughout the specification are not necessarily all referring to the same embodiment.

While the principles of the present disclosure have been described herein, it is to be understood by those skilled in the art that this description is made only by way of example and not as a limitation as to the scope of the invention. The features and aspects described with reference to particular embodiments disclosed herein are susceptible to combination and/or application with various other embodiments described herein. Such combinations and/or applications of such described features and aspects to such other embodiments are contemplated herein. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

The following is a list of reference numeral used in the specification:

| | |
|---|---|
| 100 | LED lamp |
| 102 | light module |
| 104 | heat sink |
| 106 | electronics module |
| 108 | heat-radiating fins |
| 110 | first region of heat sink |
| 112 | second region of heat sink |
| 114 | base of second region |
| 216 | heat sink assembly |
| 218 | heat sink (heat spreader) |
| 220 | upper surface of heat spreader |
| 222 | lower surface of heat spreader |
| 224 | non-metal-core circuit board |
| 226 | solid state electronic component (LED) |
| 228 | underside of LED |
| 230 | recess of heat spreader |
| 232 | first thermal interface material |
| 234 | undersurface of circuit board |
| 236 | second thermal interface material |
| 238 | housing |

| | |
|---|---|
| 240 | optical element |
| 242 | fasteners |

What is claimed is:

1. A heat sink assembly (216) for a solid state electronic component (226), said heat sink assembly (216) comprising:
   a) a heat sink (218) having an upper surface (220) facing in a first direction and a lower surface (222) facing in a second direction opposed to said first direction, said lower surface (222) adapted to thermally communicate with a second heat sink (104) when placed proximate said second heat sink (104);
   b) a non-metal-core circuit board (224) disposed in register with said heat sink upper surface (220);
   c) at least one solid state electronic component (226) mounted in electrically operative association with said circuit board (224) such that an underside (228) of each said at least one solid state electronic component (226) is not in confronting relationship with said circuit board (224);
   d) a first thermal interface material (232) disposed between said underside (228) of said at least one solid state electronic component (226) and said heat sink upper surface (220) and thermally coupled to said at least one solid state electronic component (226) and to said heat sink upper surface (220), said first thermal interface material (232) being electrically and thermally conductive; and
   e) a second thermal interface material (236) disposed in thermal communication with said heat sink lower surface (222) and adapted to spread heat to said second heat sink (104), said second thermal interface material (236) being electrically insulating and thermally conductive.

2. The heat sink assembly of claim 1, wherein said solid state electronic component (226) comprises at least one light emitting diode (LED) emitting visible light suitable for illuminating a space for area or task lighting, said heat sink assembly (216) forming a portion (102) of an LED lamp (100).

3. The heat sink assembly of claim 1, wherein said underside (228) of said at least one solid state electronic component (226) is devoid of a solder pad.

4. The heat sink assembly of claim 1, wherein the heat sink (218) is electrically isolated from said at least one solid state electronic component (220).

5. The heat sink assembly of claim 1, wherein the heat sink (218) comprises a metallic material.

6. The heat sink assembly of claim 1, wherein the heat sink (218) comprises a thermally conductive ceramic.

7. The heat sink assembly of claim 1, wherein a region between an undersurface (234) of said circuit board (224) and said heat sink (218) is devoid of said first and said second thermal interface materials (232, 236).

8. The heat sink assembly of claim 1, wherein the circuit board (224) is a type Flame Retardant Class 4 (FR-4) grade material.

9. The heat sink assembly of claim 1, wherein said at least one solid state electronic component (226) comprises a chip-on-board light emitting diode (LED).

10. The heat sink assembly of claim 1, wherein the first thermal interface material (232) exhibits a thermal impedance of less than $0.23°\,C\cdot in^2/Watt$.

11. The heat sink assembly of claim 1, wherein the first thermal interface material (232) comprises a conductive adhesive.

12. The heat sink assembly of claim 11, wherein the conductive adhesive is metal filled.

13. The heat sink assembly of claim 1, wherein the first thermal interface material (232) comprises a thermal grease.

14. The heat sink assembly of claim 1, wherein the second thermal interface material (236) comprises a fiberglass reinforced silicone elastomer.

15. The heat sink assembly of claim 1, further comprising a housing (238) disposed on said heat sink (218), said housing (238) containing at least one optical element (240) in register with, and positioned in optically operative relationship to, said at least one solid state electronic component (226).

\* \* \* \* \*